United States Patent [19]
Nakashiro et al.

[11] Patent Number: 5,723,986
[45] Date of Patent: Mar. 3, 1998

[54] LEVEL SHIFTING CIRCUIT

[75] Inventors: Takeshi Nakashiro; Isao Abe; Takeshi Suyama, all of Kanagawa-ken; Junichi Machida, Chiba-ken, all of Japan

[73] Assignee: Kabushiki Kaisha Toshiba, Kawasaki, Japan

[21] Appl. No.: 659,000

[22] Filed: Jun. 4, 1996

[30] Foreign Application Priority Data

Jun. 5, 1995 [JP] Japan ................. 7-137781

[51] Int. Cl.$^6$ ............................... H03K 19/0185
[52] U.S. Cl. ........................... 326/81; 326/63; 326/80
[58] Field of Search ................. 326/63, 73, 80–81, 326/121

[56] References Cited

U.S. PATENT DOCUMENTS

| | | | |
|---|---|---|---|
| 4,504,747 | 3/1985 | Smith et al. | 326/80 X |
| 4,833,350 | 5/1989 | Frisch | 326/81 X |
| 5,329,185 | 7/1994 | Cooperman et al. | 326/73 X |
| 5,426,381 | 6/1995 | Flannagan et al. | 326/73 X |
| 5,467,313 | 11/1995 | Jung et al. | 326/73 X |
| 5,585,743 | 12/1996 | Kenji et al. | 326/73 |

*Primary Examiner*—David R. Hudspeth
*Attorney, Agent, or Firm*—Oblon, Spivak, McClelland, Maier & Neustadt, P.C.

[57] ABSTRACT

A level shifting circuit has a high-level shifter connected to a first high voltage and to a first low voltage, for amplifying the peak voltage of an input signal; a low-level shifter connected to a second high voltage lower than the first high voltage and to a second low voltage lower than the first low voltage, for amplifying the trough voltage of the input signal; a high-voltage controlling transistor connected to the first high voltage and to an output node and turned on and off according to the output of the high-level shifter; and a low-voltage controlling transistor connected to the output node and to the second low voltage and turned on and off according to the output of the low-level shifter complementarily to the high-voltage controlling transistor. The level shifting circuit is capable of amplifying both the peak and trough voltages of an input signal.

20 Claims, 8 Drawing Sheets

LEVEL SHIFTING CIRCUIT

BACKGROUND OF THE INVENTION

1. Field of the Invention

The present invention relates to a level shifting circuit for amplifying a signal, and particularly, to a level shifting circuit for providing a high-potential output in response to a low-potential input, used for an LSI for driving an LCD (liquid crystal display).

2. Description of the Prior Art

FIG. 1 shows a level shifting circuit according to a prior art.

A p-channel MOS transistor (hereinafter referred to as pMOS) 101 and an n-channel MOS transistor (hereinafter referred to as nMOS) 102 are connected in series between a high voltage $V_{CC}$ and a low voltage $V_{SS}$. A pMOS 103 and an nMOS 104 are connected in series between $V_{CC}$ and $V_{SS}$. The drains of the pMOS 101 and nMOS 102 are connected to a node A11, which is connected to the gate of the pMOS 103. The drains of the pMOS 103 and nMOS 104 are connected to a node A12, which is connected to the gate of the pMOS 101. A pMOS 105 and an nMOS 106 are connected in series through a node A13 between $V_{DD}$, which is a second high voltage, and $V_{SS}$, to form an inverter. The node A13 is connected to the gate of the nMOS 104. An input signal IN is applied to the gates of the nMOSs 102 and 106 and pMOS 105. The node A12 provides an output signal OUT. The input signal IN oscillates between $V_{DD}$ and $V_{SS}$. The voltages $V_{SS}$, $V_{DD}$, and $V_{CC}$ have a relationship of $V_{SS}<V_{DD}<V_{CC}$. $V_{CC}$ is applied to the sources of the pMOSs 101 and 103, $V_{DD}$ to the source of the pMOS 105, and $V_{SS}$ to the sources of the nMOSs 102, 104, and 106.

FIG. 2 is a timing chart showing the operation of the level shifting circuit of FIG. 1.

When the input signal IN is at $V_{SS}$ in a period T11, the nMOS 102 is off. At this time, the node A13 provides an inverted signal /IN at $V_{DD}$ to turn on the nMOS 104, to thereby drop the output signal OUT to $V_{SS}$. $V_{SS}$ is supplied to the pMOS 101, to turn on the same. Since the nMOS 102 is off, the node A11 increases to $V_{CC}$ to turn off the pMOS 103. Consequently, the output signal OUT is set to $V_{SS}$.

When the input signal IN changes to $V_{DD}$ in a period T12, the nMOS 102 is turned on and the nMOS 104 off. The node A11 drops to $V_{SS}$ to turn on the pMOS 103. Since the pMOS 103 is on and the nMOS 104 off, the output signal OUT increases to $V_{CC}$.

$V_{CC}$ at the node A12 turns off the pMOS 101 to set the node A11 to $V_{SS}$.

In this way, when the input signal IN is at $V_{SS}$, the output signal OUT is at $V_{SS}$, and when the input signal IN is at $V_{DD}$, the output signal OUT is at $V_{CC}$. Namely, the prior art amplifies the peak voltage of an input signal.

The prior art is capable of amplifying only the peak voltage of an input signal and incapable of amplifying both the peak and trough voltages of an input signal. When the input signal oscillates between the peak and trough voltages $V_{DD}$ and $V_{SS}$, it is impossible for the prior art to amplify the input signal so that it may oscillate between a peak voltage $V_{CC}$ that is higher than $V_{DD}$ and a trough voltage $V_{EE}$ that is lower than $V_{SS}$. If the sources of the nMOSs 102 and 104 receive $V_{EE}$, they will never be cut off whether the input signal is at $V_{DD}$ or $V_{SS}$. Namely, the nMOSs 102 and 104 are always on to never set the output signal OUT to $V_{CC}$.

SUMMARY OF THE INVENTION

An object of the present invention is to provide a level shifting circuit capable of amplifying both the peak and trough voltages of an input signal.

Another object of the present invention is to provide a level shifting circuit of low power consumption capable of amplifying both the peak and trough voltages of an input signal.

In order to accomplish the objects, a first aspect of the present invention provides a level shifting circuit of FIG. 3. The circuit has a high-level shifter 10 connected to a first high voltage $V_{CC}$ and a first low voltage $V_{SS}$, for amplifying the peak voltage of an input signal. A low-level shifter 20 is connected to a second high voltage $V_{DD}$ that is lower than $V_{CC}$ and a second low voltage $V_{EE}$ that is lower than $V_{SS}$, for amplifying the trough voltage of the input signal. The level shifting circuit of FIG. 3 further having an output circuit (41, 42) for providing the first high voltage $V_{CC}$ and second low voltage $V_{EE}$ in response to the outputs of the high-level shifter 10 and low-level shifter 20. And the output circuit comprises a high-voltage output device 41 and a low-voltage output device 42. The high-voltage output device 41 provides an output signal at $V_{CC}$ according to the output of the high-level shifter 10. The low-voltage output device 42 provides an output signal at $V_{EE}$ according to the output of the low-level shifter 20.

The high-voltage output device 41 is, for example, a high-voltage controlling transistor 41 connected to $V_{CC}$ and to an output node Q. The transistor 41 is turned on and off in response to the output of the high-level shifter 10. The low-voltage output device 42 is a low-voltage controlling transistor 42 connected to the output node Q and to $V_{EE}$. The transistor 42 is turned on and off complementarily to the transistor 41 in response to the output of the low-level shifter 20.

The high-level shifter 10 amplifies the peak voltage of an input signal, and the low-level shifter 20 amplifies the trough voltage of the input signal. An output node A1 of the high-level shifter 10 is connected to the transistor 41, and an output node B1 of the low-level shifter 20 is connected to the transistor 42, so that the output node Q may receive $V_{CC}$ and $V_{EE}$, to amplify the peak and trough voltages of the input signal.

It is preferable that the transistor 41 is turned on in response to $V_{SS}$ provided through the high-level shifter 10, and that the transistor 42 is turned on in response to $V_{DD}$ provided through the low-level shifter 20. Since $V_{DD}$ and $V_{SS}$ are intermediate with respect to $V_{CC}$ and $V_{EE}$, the transistors 41 and 42 are never turned on at full bias. This results in reducing a through current passing the transistors 41 and 42.

A second aspect of the present invention provides a level shifting circuit of FIG. 5. The circuit has a first inverter 50 between an output node A1 of a high-level shifter 10 and the control electrode of a high-voltage controlling transistor 41. The first inverter 50 operates between a first high voltage $V_{CC}$ and a second high voltage $V_{DD}$. A Second inverter 60 is arranged between an output node B1 of a low-level shifter 20 and the control electrode of a low-voltage controlling transistor 42. The second inverter 60 operates between a first low voltage $V_{SS}$ and a second low voltage $V_{EE}$.

The transistors 41 and 42 are never simultaneously turned on, as shown in FIG. 6. A through current passing the first inverter 50 and a through current passing the second inverter 60 are produced at different timing. The through current passing the first inverter 50 is produced between $V_{CC}$ and $V_{DD}$, and the through current passing the second inverter 60 between $V_{SS}$ and $V_{EE}$. Accordingly, the through currents are each small.

It is preferable that the threshold voltage of the first inverter 50 is set around $V_{CC}$ and that of the second inverter

60 around $V_{EE}$. This surely prevents a simultaneous activation of the transistors 41 and 42.

A third aspect of the present invention provides a level shifting circuit of FIG. 7. The circuit has a coupling capacitor 71 between an output node A1 of a high-level shifter 10 and an output node B1 of a low-level shifter 20.

The capacitor 71 makes a point where a potential change occurs slowly follow a point where a potential change occurs quickly, as shown in FIG. 8. Namely, the capacitor 71 shortens a time in which a through current is produced between a first high voltage $V_{CC}$ and a second low voltage $V_{EE}$, to further reduce the through current.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
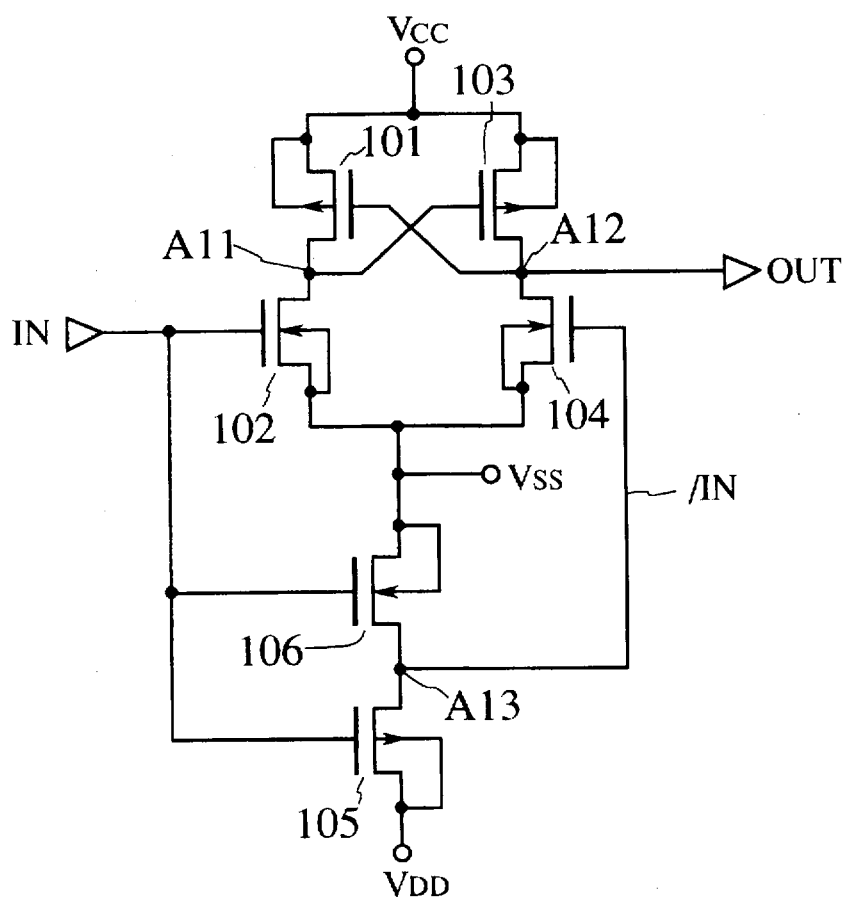
FIG. 1 is a circuit diagram showing a level shifting circuit according to a prior art.
Figure 2:
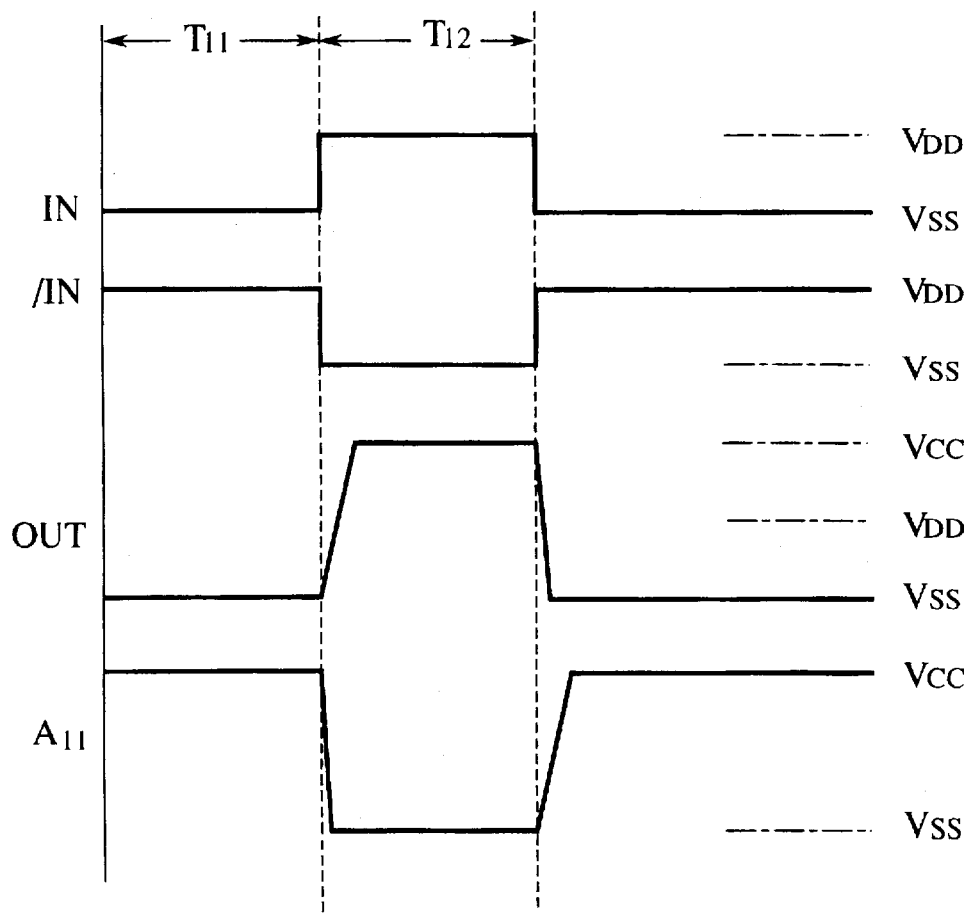
FIG. 2 is a timing chart showing the operation of the circuit of FIG. 1.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 3:
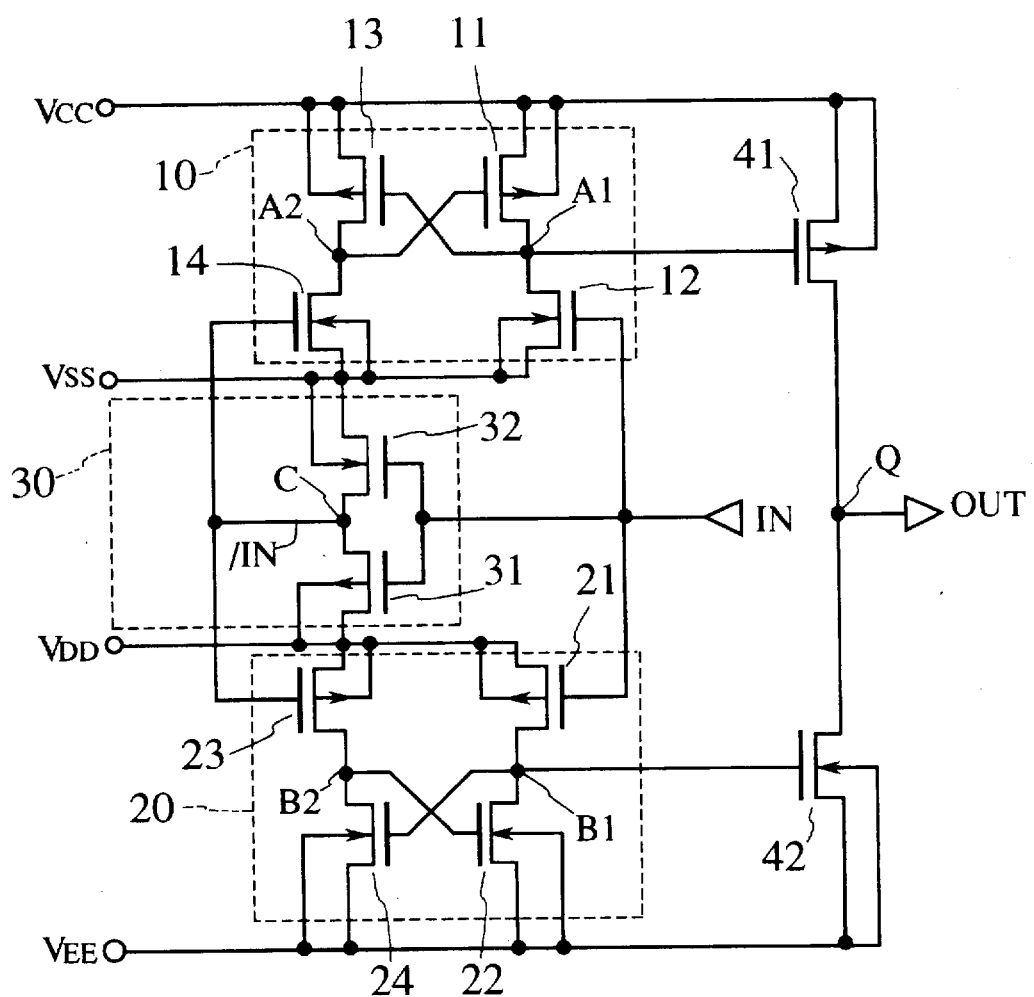
FIG. 3 is a circuit diagram showing a level shifting circuit according to a first embodiment of the present invention.

FIG. 3 is a circuit diagram showing a level shifting circuit according to the first embodiment of the present invention. A high-level shifter 10 is connected to a first high voltage $V_{CC}$ and a first low voltage $V_{SS}$, to amplify the peak voltage of an input signal IN. A low-level shifter 20 is connected to a second high voltage $V_{DD}$ and a second low voltage $V_{EE}$, to amplify the trough voltage of the input signal IN. An inverter (an input inverter) 30 is connected to $V_{SS}$ and $V_{DD}$. The high-level shifter 10 consists of a pMOS (a first pMOS) 11, an nMOS (a first nMOS) 12, a pMOS (a second pMOS) 13, and an nMOS (a second nMOS) 14. The drains of the pMOS 11 and nMOS 12 are connected to a node A1, which is connected to the gate of the pMOS 13. The drains of the pMOS 13 and nMOS 14 are connected to a node A2, which is connected to the gate of the pMOS 11. The sources of the pMOSs 11 and 13 receive $V_{CC}$, and the sources of the nMOSs 12 and 14 receive $V_{SS}$. The low-level shifter 20 consists of a pMOS (a third pMOS) 21, an nMOS (a third nMOS) 22, a pMOS (a fourth pMOS) 23, and an nMOS (a fourth nMOS) 24. The drains of the pMOS 21 and nMOS 22 are connected to a node B1, which is connected to the gate of the nMOS 24. The drains of the pMOS 23 and nMOS 24 are connected to a node B2, which is connected to the gate of the nMOS 22. The sources of the pMOSs 21 and 23 receive $V_{DD}$, and the sources of the nMOSs 22 and 24 receive $V_{EE}$.

The inverter 30 consists of a pMOS 31 and an nMOS 32. The drains of the pMOS 31 and nMOS 32 are connected to a node C. The sources of the pMOS 31 and nMOS 32 receive $V_{DD}$ and $V_{SS}$, respectively.

The level shifting circuit also has a high-voltage controlling pMOS 41 and a low-voltage controlling nMOS 42. The drains of the pMOS 41 and nMOS 42 are connected to an output node Q. The gate of the pMOS 41 is connected to the node A1 of the high-level shifter 10, and the gate of the nMOS 42 is connected to the node B1 of the low-level shifter 20. The source of the pMOS 41 receives $V_{CC}$, and the source of the nMOS 42 receives $V_{EE}$. The node Q provides an output signal OUT.

The input signal IN oscillates between $V_{DD}$ and $V_{SS}$. The voltages have a relationship of $V_{CC} > V_{DD} > V_{SS} > V_{EE}$.

Figure 4:
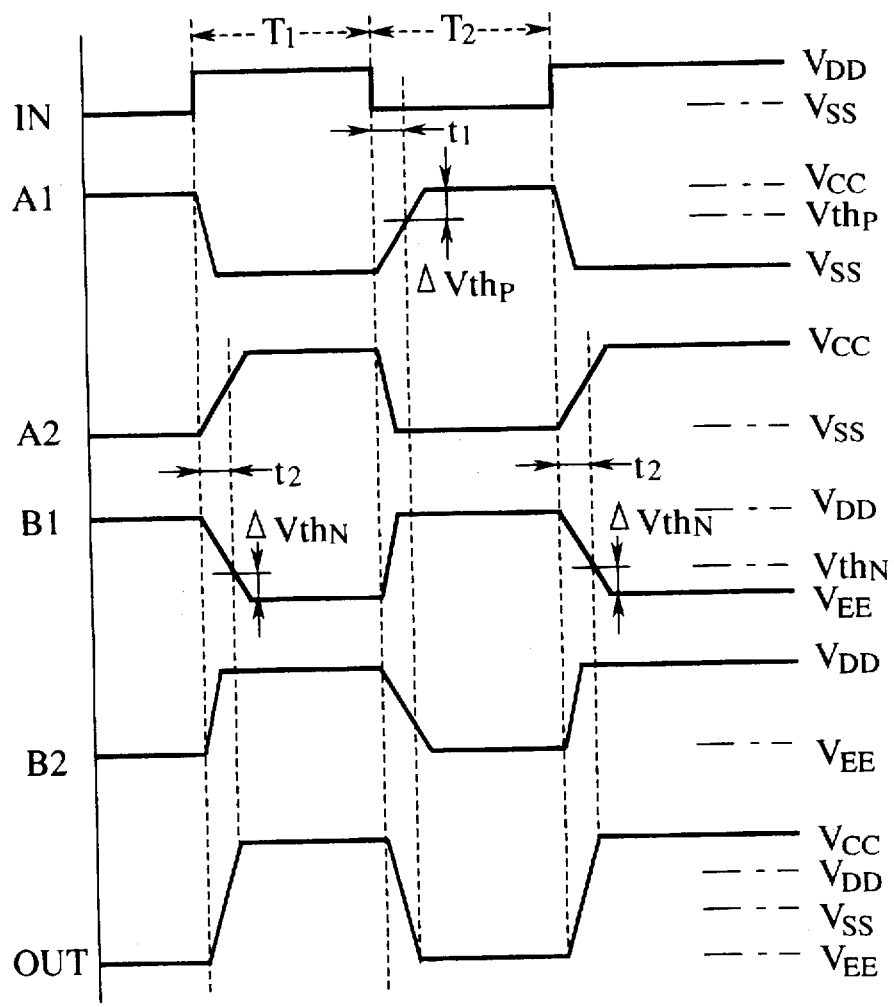
FIG. 4 is a timing chart showing the operation of the first embodiment.

The operation of the level shifting circuit will be explained with reference to the timing chart of FIG. 4.

(A) Operation with the input signal IN being at $V_{DD}$

When the input signal IN is at $V_{DD}$ in a period T1, the nMOS 12 is turned on and the pMOS 21 off. The node C of the inverter 30 provides an inverted signal /IN at $V_{SS}$ to turn off the nMOS 14 and on the pMOS 23. When the nMOS 12 is turned on, the node A1 provides $V_{SS}$ to turn on the pMOSs 13 and 41. When the pMOS 13 is turned on, the node A2 provides $V_{CC}$ to turn off the pMOS 11. When the pMOS 23 is turned on, the node B2 provides $V_{DD}$ to turn on the nMOS 22. As a result, the node B1 provides $V_{EE}$ to turn off the nMOS 42. Consequently, the output signal OUT is set to $V_{CC}$.

(B) Operation with the input signal IN changing from $V_{DD}$ to $V_{SS}$

The input signal IN changes from $V_{DD}$ to $V_{SS}$ in a period T2. Then, the nMOS 14 and pMOS 21 are changed from off to on, and the nMOS 12 and pMOS 23 from on to off. When the nMOS 14 is turned on, the node A2 provides $V_{SS}$. When the pMOS 11 is turned on, the node A1 provides $V_{CC}$. As a result, the pMOS 41 connected to the node A1 starts to change from on to off. When the node A1 exceeds "$V_{CC} - \Delta V{thp}$" where $\Delta V{thp}$ is the threshold voltage of the pMOS 41, the pMOS 41 is cut off.

When the pMOS 21 is turned on, the node B1 provides $V_{DD}$ to turn on the nMOS 24. The node B2 gradually drops to $V_{EE}$. When the node B2 drops below "$V_{EE} + \Delta V{thn}$" where $\Delta V{thn}$ is the threshold voltage of the nMOS 22, the nMOS 22 is cut off to set the node B1 to $V_{DD}$, which is supplied to the gate of the nMOS 42. When the node B1 exceeds "$V_{EE} + \Delta V{thn}$," the nMOS 42 changes from off to on. Finally, the pMOS 41 is turned off and the nMOS 42 on, and therefore, the output signal OUT is set to $V_{EE}$.

(C) Operation with the input signal IN changing from $V_{SS}$ to $V_{DD}$

The input signal IN changes from $V_{SS}$ to $V_{DD}$ after the period T2. Then, the nMOS 14 and pMOS 21 change from on to off, and the nMOS 12 and pMOS 23 from off to on. When the nMOS 12 is turned on, the node A1 drops to $V_{SS}$ to turn on the pMOS 13 and pMOS 41. When the pMOS 23 is turned on, the node B2 increases to $V_{DD}$ to change the nMOS 22 from off to on. Since the pMOS 21 is off, the node B1 gradually drops to $V_{EE}$. Accordingly, the nMOSs 24 and 42 connected to the node B1 gradually change from on to off. When the node B1 drops below "$V_{EE}+\Delta Vthn$," the nMOSs 24 and 42 are cut off. Finally, the pMOS 41 is turned on and the nMOS 42 off, to increase the output signal OUT from the node Q to $V_{CC}$.

In this way, the first embodiment of the present invention sets the output signal OUT to $V_{CC}$ when the input signal IN is at $V_{DD}$, and to $V_{EE}$ when the input signal IN is at $V_{SS}$.

While the input signal IN is rising or falling, the pMOS 41 and nMOS 42 are simultaneously on for a moment. More precisely, the transistors 41 and 42 are both on in a period t1 of FIG. 4 starting from a fall of the input signal IN until the node A1 reaches the threshold voltage Vthp of the pMOS 41, i.e., until the node A1 increases to "$V_{CC}-\Delta Vthp$" from $V_{SS}$. The transistors 41 and 42 are also both on in a period t2 of FIG. 4 starting from a rise of the input signal IN until the node B1 reaches the threshold voltage Vthn of the nMOS 42, i.e., until the node B1 drops to "$V_{EE}+\Delta Vthn$" from $V_{DD}$. In each of the periods t1 and t2, a through current passes from the pMOS 41 to the nMOS 42 between $V_{CC}$ and $V_{EE}$. At this time, the gate of the pMOS 41 receives the intermediate voltage $V_{SS}$, and the gate of the nMOS 42 receives the intermediate voltage $V_{DD}$. Accordingly, the transistors 41 and 42 are not fully biased with respect to the source voltages $V_{CC}$ and $V_{EE}$. This results in increasing the on-resistance of each of the transistors 41 and 42, to reduce each through current produced between $V_{CC}$ and $V_{EE}$.

In this way, the level shifting circuit of the first embodiment is capable of amplifying both the peak and trough voltages of an input signal without delay. This results in eliminating a time lag between input and output. Although the circuit produces a through current when amplifying an input signal, the through current is small because it is not produced under a full bias state. Accordingly, the level shifting circuit of the first embodiment is realized with a small number of devices, to reduce power consumption.

(Second Embodiment)

Figure 5:
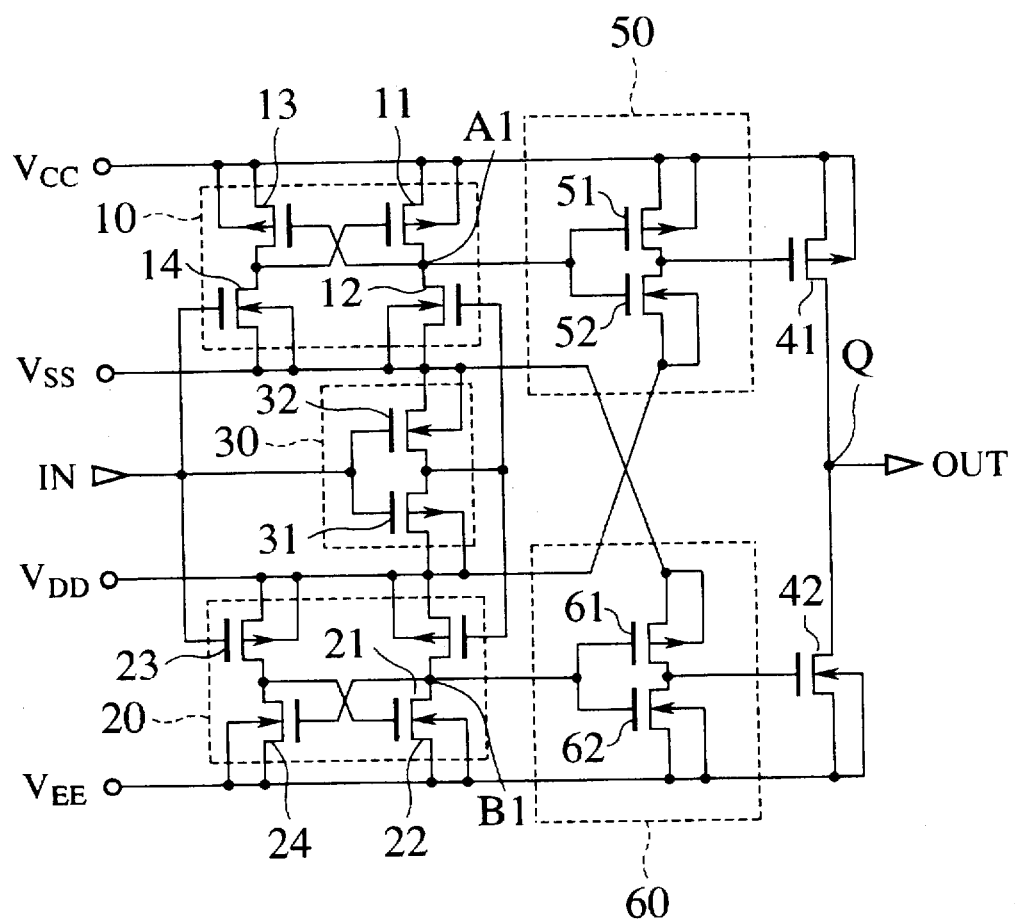
FIG. 5 is a circuit diagram showing a level shifting circuit according to a second embodiment of the present invention.

FIG. 5 shows a level shifting circuit according to the second embodiment of the present invention. The same parts as those of FIG. 3 are represented with like reference numerals.

A first inverter 50 is arranged between an output node A1 of a high-level shifter 10 and the gate of a high-voltage controlling pMOS 41. The first inverter 50 consists of a pMOS 51 and an nMOS 52 connected in series between a first high voltage $V_{CC}$ and a second high voltage $V_{DD}$. A second inverter 60 is arranged between an output node B1 of a low-level shifter 20 and the gate of a low-voltage controlling pMOS 42. The second inverter 60 consists of a pMOS 61 and an nMOS 62 connected in series between a first low voltage $V_{SS}$ and a second low voltage $V_{EE}$. This arrangement is capable of reducing a through current more than the arrangement of FIG. 3. To effectively reduce the through current, the threshold voltages Vth50 and Vth60 of the inverters 50 and 60 are set around $V_{CC}$ and $V_{EE}$, respectively.

Figure 6:
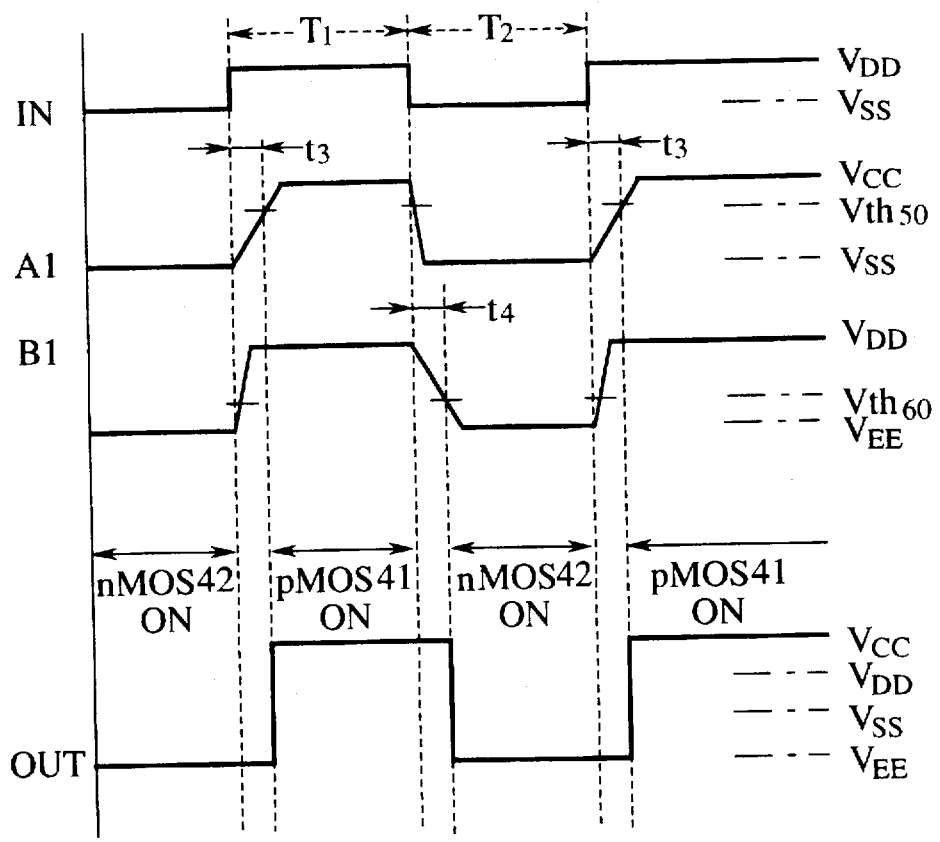
FIG. 6 is a timing chart showing the operation of the second embodiment.

On the contrary to the first embodiment of FIG. 3, an output signal OUT of the second embodiment is set to $V_{CC}$ at a rise of the node A1 and to $V_{EE}$ at a fall of the node B1. Since the threshold voltages Vth50 and Vth60 of the inverters 50 and 60 are set around $V_{CC}$ and $V_{EE}$, respectively, the pMOS 41 and nMOS 42 are never simultaneously turned on, as shown in FIG. 6. Accordingly, no through current is produced between $V_{CC}$ and $V_{EE}$ unlike the first embodiment. Instead, the inverters 50 and 60 produce through currents, which are smaller than the through current produced between $V_{CC}$ and $V_{EE}$ by the first embodiment.

The inverters 50 and 60 produce the through currents at different timing when a change at the nodes A1 and B1 becomes dull. At the node A1, the through current occurs at a rise of the input signal IN during a period t3 of FIG. 6. At the node B1, the through current occurs at a fall of the input signal IN during a period t4. The inverter 50 connected to the node A1 produces the through current between $V_{CC}$ and $V_{DD}$, and the inverter 60 connected to the node B1 produces the through current between $V_{SS}$ and $V_{EE}$. These voltages have a relationship of $V_{CC}>V_{DD}>V_{SS}>V_{EE}$. Accordingly, the potential difference of each through current is small, and therefore, the through current of the second embodiment is smaller than the through current produced between $V_{CC}$ and $V_{EE}$ of the first embodiment.

In this way, the second embodiment produces through currents between $V_{CC}$ and $V_{DD}$ and between $V_{SS}$ and $V_{EE}$. On the other hand, the first embodiment produces the through current between $V_{CC}$ and $V_{EE}$. The second embodiment produces the through current between $V_{CC}$ and $V_{DD}$ when the input signal IN rises, and at this time, the first embodiment produces the through current between $V_{CC}$ and $V_{EE}$. Also, the second embodiment produces the through current between $V_{SS}$ and $V_{EE}$ when the input signal IN falls, and at this time, the first embodiment produces the through current between $V_{CC}$ and $V_{EE}$.

If $V_{CC}=30$ V$>V_{DD}=20$ V$>V_{SS}=10$ V$>V_{EE}=0$ V, a voltage width that produces a through current of the second embodiment is 10 V, and that of the first embodiment is 30 V. Accordingly, each through current of the second embodiment is smaller than that of the first embodiment.

(Third Embodiment)

Figure 7:
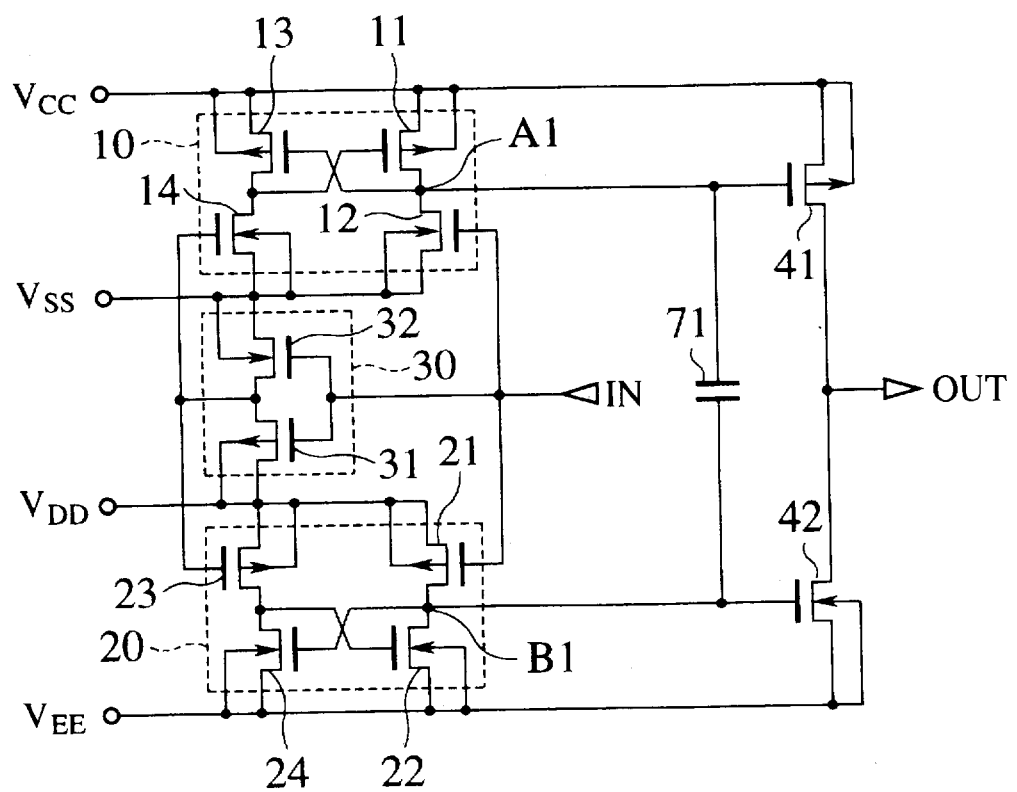
FIG. 7 is a circuit diagram showing a level shifting circuit according to a third embodiment of the present invention.
Figure 8:
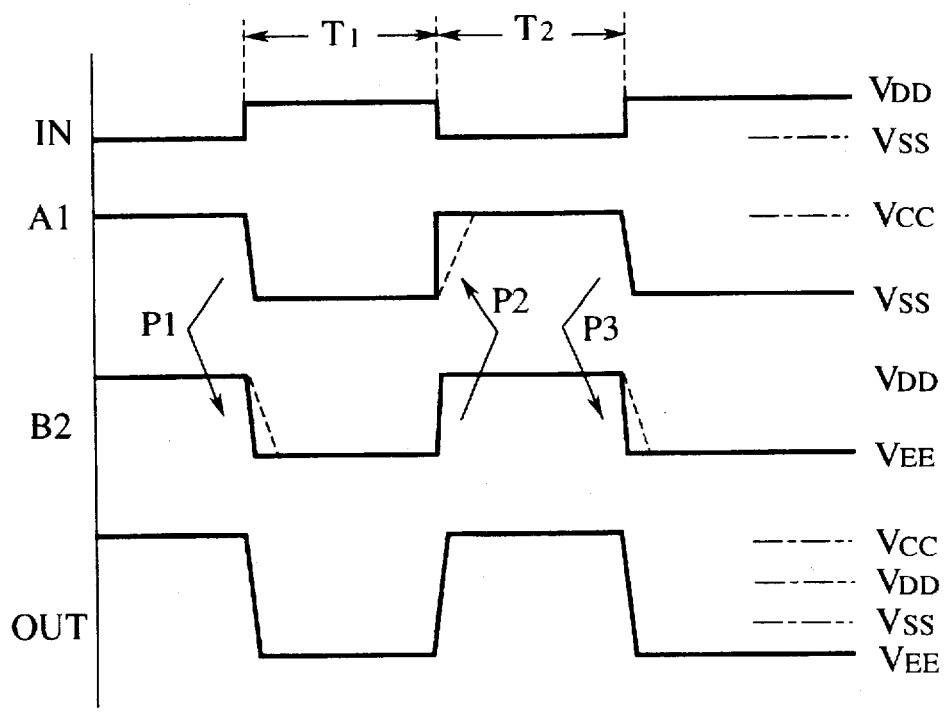
FIG. 8 is a timing chart showing the operation of the third embodiment.

FIG. 7 is a circuit diagram showing a level shifting circuit according to the third embodiment of the present invention. The same parts as those of FIG. 3 are represented with like reference numerals. To reduce a through current produced between a first high voltage $V_{CC}$ and a second low voltage $V_{EE}$, the third embodiment arranges a coupling capacitor 71 between nodes A1 and B1, to simultaneously change voltages at the nodes A1 and B1. Other parts of the third embodiment are the same as those of the first embodiment. The through current of the first embodiment occurs due to a time lag in a voltage change between the nodes A1 and B1. As indicated with P1, P2, and P3 in the timing chart of FIG. 8, the capacitor 71 makes a point where a voltage change is slow follow a point where a voltage change is quick. This results in shortening a period in which a through current is produced between $V_{CC}$ and $V_{EE}$ less than the first embodiment, thereby further reducing the through current itself.

Various modifications will become possible for those skilled in the art after receiving the teachings of the present disclosure without departing from the scope thereof.

What is claimed is:

1. A level shifting circuit connected to first and second high voltages and first and second low voltages, the circuit comprising:
   (a) a high-level shifter connected to the first high and low voltages, for amplifying the peak voltage of an input signal;
   (b) a low-level shifter connected to the second high and low voltages, for amplifying the trough voltage of the input signal; and (c) an output circuit for providing the first high voltage and second low voltage in response to the outputs of the high- and low-level shifters, the first high voltage being higher than the second high voltage, and the second low voltage being lower than the first low voltage.

2. A circuit of claim 1, wherein the output circuit comprises a high-voltage controlling transistor and a low-voltage controlling transistor that is complementarily turned on and off with respect to the high-voltage controlling transistor.

3. A circuit of claim 2, wherein a first main electrode of the high-voltage controlling transistor is connected to the first high voltage, a first main electrode of the low-voltage controlling transistor is connected to the second low voltage, and a second main electrode of the high-voltage controlling transistor is connected to a second main electrode of the low-voltage controlling transistor through an output node of the level shifting circuit.

4. A circuit of claim 3, wherein a control electrode of the high-voltage controlling transistor is electrically coupled with an output node of the high-level shifter, and a control electrode of the low-voltage controlling transistor is electrically coupled with an output node of the low-level shifter.

5. A circuit of claim 4, further comprising:

a first inverter connected to the output node of the high-level shifter and to the control electrode of the high-voltage controlling transistor and operating between the first and second high voltages; and a second inverter connected to the output node of the low-level shifter and to the control electrode of the low-voltage controlling transistor and operating between the first and second low voltages.

6. A circuit of claim 1, further comprising:

a coupling capacitor connected to the output node of the high-level shifter and to the output node of the low-level shifter.

7. A circuit of claim 2, further comprising:

a coupling capacitor connected to the output node of the high-level shifter and to the output node of the low-level shifter.

8. A circuit of claim 3, further comprising:

a coupling capacitor electrically coupled with the output node of the high-level shifter and with the output node of the low-level shifter.

9. A circuit of claim 4, further comprising:

a coupling capacitor electrically coupled with the output node of the high-level shifter and with the output node of the low-level shifter.

10. A circuit of claim 2, wherein the output level of the high-level shifter to turn on the high-voltage controlling transistor corresponds to the first low voltage, and the output level of the low-level shifter to turn on the low-voltage controlling transistor corresponds to the second high voltage.

11. A circuit of claim 3, wherein the output level of the high-level shifter to turn on the high-voltage controlling transistor corresponds to the first low voltage, and the output level of the low-level shifter to turn on the low-voltage controlling transistor corresponds to the second high voltage.

12. A circuit of claim 4, wherein the output level of the high-level shifter to turn on the high-voltage controlling transistor corresponds to the first low voltage, and the output level of the low-level shifter to turn on the low-voltage controlling transistor corresponds to the second high voltage.

13. A circuit of claim 5, wherein the output level of the high-level shifter to turn on the high-voltage controlling transistor corresponds to the first low voltage, and the output level of the low-level shifter to turn on the low-voltage controlling transistor corresponds to the second high voltage.

14. A circuit of claim 5, wherein the threshold voltage of the first inverter is set around the first high voltage, and the threshold voltage of the second inverter is set around the second low voltage.

15. A circuit of claim 1, further comprising an input inverter electrically coupled with the high- and low-level shifters, for inverting an input signal provided for the level shifting circuit and supplying the inverted signal to the high- and low-level shifters.

16. A circuit of claim 5, further comprising an input inverter electrically coupled with the high- and low-level shifters, for inverting an input signal provided for the level shifting circuit and supplying the inverted signal to the high- and low-level shifters.

17. A circuit of claim 1, wherein:

the high-level shifter comprises:

a first p-channel MOS transistor (hereinafter referred to as pMOS) having a source connected to the first high voltage;

a first n-channel MOS transistor (hereinafter referred to as nMOS) having a source connected to the first low voltage and a drain connected to the drain of the first pMOS;

a second pMOS having a source connected to the first high voltage and a gate connected to the drain of the first pMOS; and a second nMOS having a source connected to the first low voltage and a drain connected to the drain of the second pMOS and the gate of the first pMOS, and the low-level shifter comprises:

a third pMOS having a source connected to the second high voltage;

a third nMOS having a source connected to the second low voltage and a drain connected to the drain of the third pMOS;

a fourth pMOS having a source connected to the second high voltage and a drain connected to the gate of the third nMOS; and a fourth nMOS having a source connected to the second low voltage, a drain connected to the drain of the fourth pMOS and a gate connected to the drain of the third pMOS.

18. A circuit of claim 5, wherein:

the first inverter is a CMOS inverter having a pMOS whose source is connected to the first high voltage and an nMOS whose source is connected to the second high voltage, and the second inverter is a CMOS inverter having a pMOS whose source is connected to the first low voltage and an nMOS whose source is connected to the second low voltage.

19. A circuit of claim 15, wherein the input inverter is a CMOS inverter having an nMOS whose source is connected to the first low voltage and a pMOS whose source is connected to the second high voltage.

20. A circuit of claim 16, wherein the input inverter is a CMOS inverter having an nMOS whose source is connected to the first low voltage and a pMOS whose source is connected to the second high voltage.

* * * * *